United States Patent [19]

McHerron et al.

[11] Patent Number: 5,744,752
[45] Date of Patent: Apr. 28, 1998

[54] HERMETIC THIN FILM METALLIZED SEALBAND FOR SCM AND MCM-D MODULES

[75] Inventors: Dale C. McHerron, Modena; Hilton T. Toy, Wappingers Falls, both of N.Y.

[73] Assignee: International Business Machines Corporation, Armonk, N.Y.

[21] Appl. No.: 464,230

[22] Filed: Jun. 5, 1995

[51] Int. Cl.⁶ .................................................. H01L 23/02
[52] U.S. Cl. ......................... 174/52.4; 257/678; 257/704; 257/779; 257/781
[58] Field of Search ........................... 174/52.1–52.4; 257/666, 678, 704, 737, 738, 779, 781, 787, 789; 361/679, 748

[56] References Cited

U.S. PATENT DOCUMENTS

| | | | |
|---|---|---|---|
| 3,619,233 | 11/1971 | Grove et al. | 117/22 |
| 3,638,076 | 1/1972 | Koons | 317/230 |
| 3,770,404 | 11/1973 | Koons | 65/59 |
| 3,936,864 | 2/1976 | Benjamin | 357/74 |
| 3,957,538 | 5/1976 | Fairweather et al. | 136/133 |
| 4,094,514 | 6/1978 | Johnson | 277/92 |
| 4,142,203 | 2/1979 | Dietz | 357/80 |
| 4,212,349 | 7/1980 | Andros et al. | 165/105 |
| 4,261,584 | 4/1981 | Browne et al. | 277/206 |
| 4,291,815 | 9/1981 | Gordon et al. | 220/200 |
| 4,294,729 | 10/1981 | Bakos et al. | 252/545 |
| 4,313,492 | 2/1982 | Andros et al. | 165/104.26 |
| 4,401,766 | 8/1983 | Kyle | 501/15 |
| 4,410,647 | 10/1983 | Susko et al. | 524/88 |
| 4,411,680 | 10/1983 | Kyle | 65/33 |
| 4,463,315 | 7/1984 | Kutzler | 324/382 |
| 4,471,259 | 9/1984 | Stoermer et al. | 310/353 |
| 4,603,345 | 7/1986 | Lee et al. | 357/81 |
| 4,610,934 | 9/1986 | Boecker et al. | 428/627 |
| 4,657,337 | 4/1987 | Kyle | 339/278 |
| 4,722,586 | 2/1988 | Dodson et al. | 350/96.2 |
| 4,746,583 | 5/1988 | Falanga | 428/632 |
| 4,764,846 | 8/1988 | Go | 361/388 |
| 4,806,704 | 2/1989 | Belke, Jr. et al. | 174/52.4 |
| 4,824,123 | 4/1989 | Chia et al. | 277/84 |
| 4,830,264 | 5/1989 | Bitaillou et al. | 228/180.2 |
| 4,871,108 | 10/1989 | Boecker et al. | 228/122 |
| 5,001,546 | 3/1991 | Butt | 357/71 |
| 5,016,138 | 5/1991 | Woodman | 361/381 |
| 5,032,788 | 7/1991 | Ringleb et al. | 324/158 |
| 5,132,185 | 7/1992 | Iacovangelo | 428/610 |
| 5,134,461 | 7/1992 | Yamakawa et al. | 357/71 |
| 5,139,972 | 8/1992 | Neugebauer et al. | 433/209 |
| 5,183,269 | 2/1993 | Black et al. | 277/37 |
| 5,188,280 | 2/1993 | Nakao et al. | 228/180.2 |
| 5,229,727 | 7/1993 | Clark et al. | 333/33 |
| 5,247,779 | 9/1993 | Wirsig et al. | 53/374.2 |
| 5,276,455 | 1/1994 | Fitzsimmons et al. | 343/777 |
| 5,280,413 | 1/1994 | Pai | 361/792 |
| 5,302,219 | 4/1994 | Hargis | 156/89 |
| 5,311,059 | 5/1994 | Banerji et al. | 257/778 |
| 5,311,402 | 5/1994 | Kobayashi et al. | 361/760 |
| 5,325,265 | 6/1994 | Turlik et al. | 361/702 |
| 5,336,928 | 8/1994 | Neugebauer | 257/758 |
| 5,337,588 | 8/1994 | Chhatwal | 70/278 |
| 5,360,988 | 11/1994 | Uda et al. | 257/529 |
| 5,371,404 | 12/1994 | Juskey et al. | 257/659 |
| 5,378,313 | 1/1995 | Pace | 156/643 |
| 5,413,489 | 5/1995 | Switky | 439/71 |
| 5,498,900 | 3/1996 | Dunaway et al. | 257/659 |
| 5,506,448 | 4/1996 | Morishige | 257/697 |

*Primary Examiner*—Bot L. Ledynh
*Attorney, Agent, or Firm*—DeLio & Peterson, LLC; Peter W. Peterson; Dale M. Crockatt

[57] ABSTRACT

A module for encapsulating a microelectronic device has a polished mating surface around the periphery of the substrate on which is deposited at least one thin film sealband fabricated at a temperature no greater than about 400° C. The sealband has a thickness of less than about 0.001 in. and comprising a metal capable of wetting molten solder which has a melting point no greater than about 400° C. and adhering to the solder after solidification. A layer of the solder is disposed between the sealbands of the cap and substrate forming a hermetic seal for the module.

10 Claims, 1 Drawing Sheet

HERMETIC THIN FILM METALLIZED SEALBAND FOR SCM AND MCM-D MODULES

BACKGROUND OF THE INVENTION

1. Field of the Invention

This invention relates to hermetic sealing of encapsulated microelectronic devices and in particular to a thin film sealband for sealing a ceramic substrate to a cap in a multi-chip module.

2. Description of Related Art

Hermetic sealing of single-chip modules (SCM) and multi-chip modules (MCM) has conventionally been made either by mechanical sealing or by thick metallic film sealbands which typically utilize high temperature, gold based solders. MCM-D modules are produced with thin film underlying wiring for the chips deposited on the substrate surface, for example, by alternately depositing thin film layers organic dielectric material such as polyimides and thin film metal wiring layers such as copper. For MCM-D modules, mechanical C-ring seals have been utilized in the past. The C-ring seal typically increases module cost due to the extra hardware required to support the substrate of the module as well as the additional substrate processing to create the flange for sealing.

Hermetically sealed multi-chip modules made with ceramic based pastes to create the wiring layer (MCM-C modules) have utilized a thick (greater than 0.001 in.) film metal sealband and solder to hermetically seal the module and ceramic cap. To make the metal sealband, one or more layers of thick film metal paste may be screened onto the top layer of the ceramic MCM-C substrate and then sintered at high temperatures, generally above 500° C. It has been found that use of this thick film technology is not compatible with MCM-D module processing. The thick film sealband has a significant height which interferes with thin film processing of the wiring layers beneath the semiconductor chip. Also, the MCM-D substrate must be lapped and polished prior to thin film processing to create a smooth, planar surface. This process step would necessarily remove the thick film sealband.

Furthermore, prior art methods have not provided multiple rework capability for sealbands on MCM-C modules, i.e., they have generally not permitted the solder seal to be remelted and replaced in a course of modifying or repairing a module.

Bearing in mind the problems and deficiencies of the prior art, it is therefore an object of the present invention to provide an improved system and method of sealing for multi-chip modules employing thin film wiring layers for connecting the electronic chips thereon.

It is another object of the present invention to provide an improved system and method of sealing a module chip to a ceramic substrate which does not employ thick film technology.

A further object of the invention is to provide a method of sealing a module while maintaining a planar, smooth surface substrate during fabrication of thin film interconnect structures.

It is yet another object of the present invention to provide a low temperature fabrication process for module sealbands.

It is another object of the present invention to provide a hermetic solder seal for modules with multiple rework capability.

It is a further object of the present invention to provide a method of fabricating a sealband on a module substrate and subsequently seal the module after thin film interconnects have been built and tested, without affecting the performance or reliability of the thin film interconnect structure.

Still other objects and advantages of the invention will in part be obvious and will in part be apparent from the specification.

SUMMARY OF THE INVENTION

The above and other objects, which will be apparent to one skilled in the art, are achieved in the present invention which provides, in one aspect, a module for encapsulating at least one microelectronic device. The module includes a cap for the module having a mating surface extending uninterruptedly around the periphery of the cap. A ceramic substrate for the module has a polished planar upper surface upon which is deposited a thin film wiring layer for the microelectronic device comprising at least one polymeric dielectric material and at least one wiring path of metallic material. The substrate has a mating surface on the polished surface extending uninterruptedly around the periphery of the substrate. At least one thin film sealing layer is provided on the mating surface of the substrate, the thin film sealing layer preferably being fabricated at a temperature no greater than about 400° C. The sealing layer has a thickness of less than about 0.001 in. and comprising a metal capable of wetting molten solder which has a melting point no greater than about 400° C. and adhering to the solder after solidification. A layer of the solder is disposed between the sealing layers of the cap and substrate forming a hermetic seal for the module.

In another aspect, the present invention provides a method of manufacturing a hermetic seal in an encapsulated microelectronic device comprising the steps of:

a) obtaining a ceramic substrate and a cap for the microelectronic device, the cap and substrate having complimentary mating surfaces for creating a hermetic seal when the substrate and cap are joined; the mating surface of at least the substrate comprising polished ceramic and having deposited thereon at least one thin film sealing layer of a metal capable of wetting molten solder and adhering to the solder after solidification, the mating surface of the cap being capable of wetting molten solder and adhering to the solder after solidification, each of the mating surfaces extending uninterrupted around each of the substrate and cap;

b) mating the ceramic substrate and the cap such that the sealing layers of the cap and substrate are proximately positioned;

c) applying a layer of molten solder having a melting point no greater than about 400° C. between the sealing layers of the cap and substrate;

d) heating the ceramic substrate, cap and solder to a temperature no greater than about 400° C.; and e) solidifying the solder to form a hermetic seal between the cap and substrate of the microelectronic device.

The substrate employed in the present invention is preferably for a MCM-D module. Such a substrate has a polished planar upper surface upon which is deposited a thin film wiring layer for the microelectronic device comprising at least one polymeric dielectric material and at least one wiring path of metallic material. Each of the complimentary mating surfaces are preferably planar and each thin film sealing layer has a thickness of no greater than about 0.001 in.

The thin film layers of the sealband may comprises successive layers of chromium, nickel and gold deposited directly on the ceramic mating surface without an intermediate treatment layer. The thin film sealband layers may be patternwise deposited onto the substrate mating surface to form a thin film around the ceramic substrate by evaporation deposition., sputtering deposition or photo-lithographic deposition. Solder employed may be Pb—Sn solders or any soft solders such as those based on Pb, Sn, Bi, In, Ag or Sb that reflow at temperatures no greater than about 400° C.

The mating surface of the module cap may comprise polished ceramic having deposited thereon at least one thin film sealing layer of a metal capable of wetting molten solder and adhering to the solder after solidification as described in connection with the module substrate.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
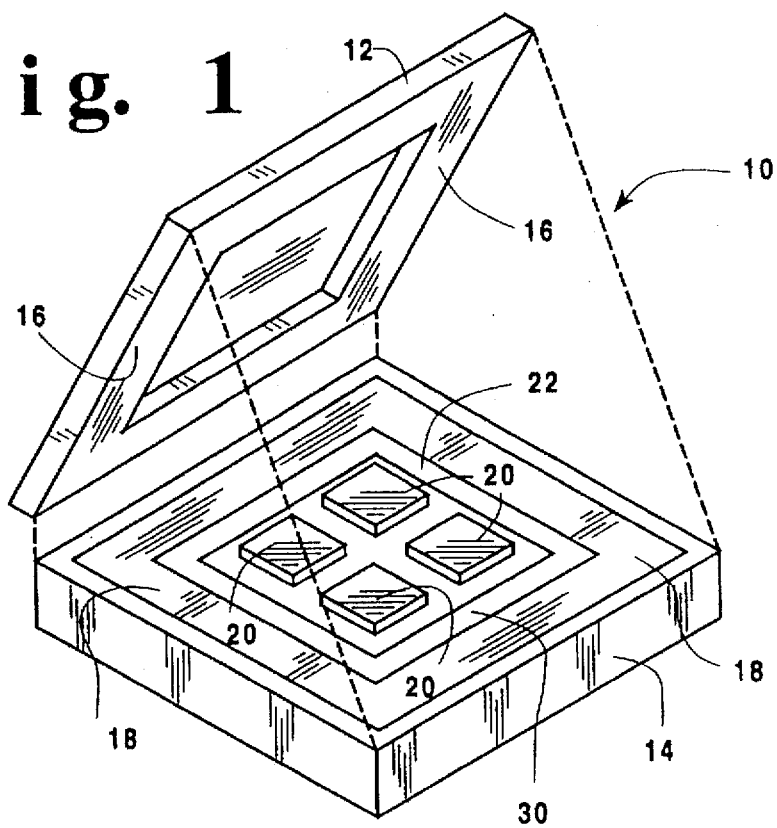
FIG. 1 is an exploded perspective view of a ceramic substrate and cap for encapsulating a microelectronic device in accordance with the present invention.
Figure 2:
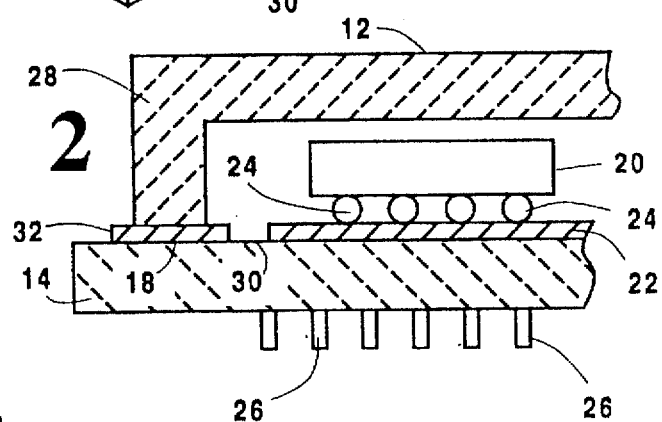
FIG. 2 is a cross sectional elevational view of a portion of a hermetically sealed ceramic substrate and cap encapsulating a microelectronic device in accordance with the present invention.
Figure 3:
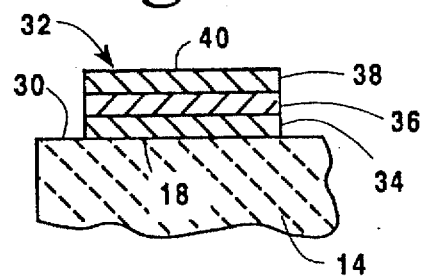
FIG. 3 is a detailed view of a portion of FIG. 2 showing a preferred embodiment of a cross sectional elevational view of the sealing layer on the ceramic substrate.

In describing the preferred embodiment of the present invention, reference will be made herein to FIGS. 1–5 of the drawings in which like numerals refer to like features of the invention. Features of the invention are not necessarily shown to scale in the drawings.

The present invention is directed preferably to a SCM-D module or to a MCM-D module such as that shown in FIG. 1. MCM-D module 10 comprises cap 12 which may be fitted over a substrate 14. The purpose of the cap is to protect and seal the chips and associated cooling and connect structure mounted therein. Substrate 14 as shown has initially deposited on substrate upper surface 30 a thin film wiring or interconnect structure 22. Microelectronic devices or chips 20 are mounted on and electrically connected to interconnect structure 22. The thin film interconnect structure may be deposited by any method known in the prior art and preferably employs multiple alternating layers of a polymeric dielectric material such as a polyimide and alternating layers of wiring paths of an electrically conductive metallic material such as copper. Thin film interconnect structure 22 creates the electrical connection between input/output connectors 26 underlying substrate 14 and wire bonds, TAB connections or solder balls 24 beneath microelectronic devices 20 (see FIG. 2).

Ceramic substrate 14 is preferably made of 9211 alumina, but may also be made of other conventional substrate materials such as mullite, glass ceramic or alumina of other compositions. Alternatively, the present invention is not limited to ceramic substrates, but may also be employed with non-ceramic substrates such as aluminum and silicon substrates. The material for cap 12 should be compatible with the substrate, including having a matching coefficient of thermal expansion. Preferably, before thin film interconnect structure 22 is deposited on substrate 14, the entire substrate surface 30 is lapped and polished so that a smooth, planar surface is obtained. Preferably the surface roughness is no greater than about 500 angstroms $R_a$. This surface roughness is a desirable prerequisite for the application of the thin films of both interconnect structure 22 and the sealband, which is discussed below.

Before or after interconnect structure 22 is deposited on substrate surface 30, but in any event before microelectronic devices 20 are attached in an array to the interconnect structure, there is deposited a thin film metallized sealband on mating surface 18 of substrate 14. Mating surface 18 extends around the peripheral edge of the substrate and, in the preferred embodiment shown, is on the same polished plane as 30 as the interconnect structure. As shown in more detail in FIGS. 2 and 3, the preferred thin film sealband 32 on mating surface 18 comprises multiple, sequential, thin layers of chromium 34, nickel 36 and gold 38. The chromium is preferably applied directly to the polished but otherwise untreated mating surface 18 of the ceramic substrate, and the layers of nickel and gold are each deposited directly on the preceding layer. Free upper surface 40 comprises gold. As used herein, the term "thin" refers to layers less than 0.0010 in. (40 micrometers) in thickness. Preferably, the thickness range of chromium layer 34 is from about 100–700 angstroms, the thickness range of nickel layer 36 is from about 1–3 micrometers and the thickness range of gold layer 38 is less than about 2500 angstroms.

The purpose of the initial chromium layer is to provide good adhesion between the polished ceramic substrate material and the subsequent metallic layers. While the gold layer is preferred for interfacing with the subsequently applied solder, it has been found that an intermediate layer of nickel primarily provides mechanical strength for the sealband as well as good adhesion between the gold layer and the chromium layer. Alternately, sequential layer of chromium, copper, nickel and gold have been successfully utilized for the thin film metallized sealband of the present invention.

Thin film metallic layers 32 may be deposited by any known technique, provided that the deposition and associated processing takes place at a temperature no greater than about 400° C. This prevents damage to polymers in the preferred MCM-D interconnect structure which has been previously deposited in the central portion of the module substrate. Examples of preferred deposition processes for the thin film sealband layers are evaporation deposition, sputtering deposition and photo-lithographic deposition, including electro- and electroless plating. In each instance it is desirable to provide a mask or pattern to assure that the film is deposited only on the desired mating surface portion of the substrate so that the sealband forms an uninterrupted band along the periphery of the substrate 14 and completely encircles the central chip area of the module.

Figure 4:
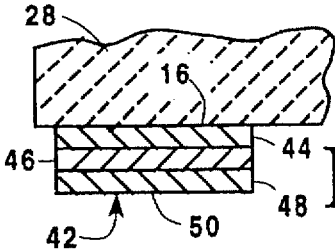
FIG. 4 is a detailed view of a portion of FIG. 2 showing an alternative embodiment of a cross sectional elevational view of the sealing layer on the cap.

Mating surface 16 on cap 12 compliments substrate mating surface 18. Mating surface 16 should be compatible with the solder material which is to be applied to seal the cap and substrate, i.e., it should adequately wet the solder and adhere to it after solidification. Since the cap for MCM-D modules may not incorporate thin film structures, and therefor may not have the same temperature restrictions as the substrate, cap mating surface 16 may have deposited thereon any conventional sealband material such as the thick film sealbands used in the prior art. However, cap mating surface 16 may also utilize thereon the thin film metallized sealband employed on the substrate of the present invention. As shown in FIG. 4, cap sealband 42 includes the sequential layers of chromium 44, nickel 46 and gold 48 deposited in the same manner described previously for the substrate. Free surface 50 of the gold layer is then available for receiving the sealing solder.

Figure 5:
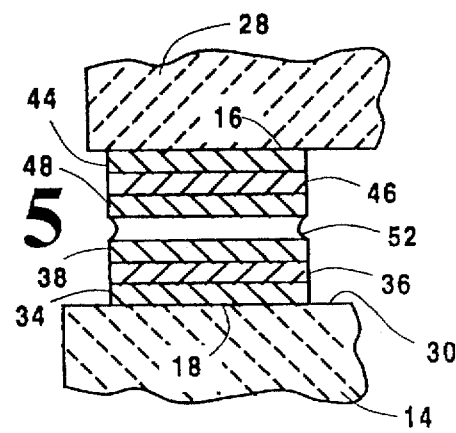
FIG. 5 is a detailed view of a portion of FIG. 2 showing an alternative embodiment of a cross sectional elevational view of the completed hermetic seal between the ceramic substrate and cap.

Upon completion of assembly of the microelectronic devices on interconnect structure 22, module 10 is then ready for sealing. As shown in FIG. 5, as the cap mating surface 16 is placed over substrate mating surface 18, and the respective sealbands 42, 32 are brought in proximity, there is applied a layer of solder 52. This solder may be applied as a preformed band of solid solder or by other methods known in the art. The solders employed to produce the preferred hermetically sealed module of the present invention should melt and flow at a temperature no greater than about 400° C. Suitable solders include lead tin solders and any soft solders such as those based on lead, tin, bismuth, Indium, gold or antimony that fellow at temperatures no greater than about 400° C.

To effect sealing, the sealband is heated to melt the solder and to permit it to flow between free surface 50 of the cap sealband and free surface 40 of the substrate sealband. The solder is then flowed between the sealbands by heating entire module 10 to no greater than 400° C. to prevent deterioration and damage to interconnect structure 22 in the MCM-D module. The entire assembly is subsequently cooled and the solder layer 52 is solidified to complete hermetic sealing of the sealband around the peripheral edge of the cap and substrate.

The advantages achieved by the present invention include the ability to maintain a planar, smooth surface during fabrication thin film interconnect structures. One of the prerequisites found for thin film fabrication is that the substrate must be planar and void free in order to ensure uniform film thicknesses and critical dimensions of structural feature. Another advantage is low temperature fabrication. Thin film interconnect structures cannot withstand temperature in excess of 400° C. in an inert atmosphere and in excess of 200° C. in an oxide atmosphere. Also, the present invention incorporates thin film metallurgy in the sealband to provide a hermetic solder seal with multiple rework capability. Because of the high cost of MCM-D substrates and integrated circuit devices, it is highly desirable to have a sealing technology that maintains hermeticity after multiple reworks, i.e., melting the solder to remove the cap and then resoldering the cap on after repair or rework to the semiconductor devices. The present invention has demonstrated reworkability and hermeticity as well as stress testing in module such as those described herein. Finally, an important advantage of this invention lies in the ability to fabricate the sealband on the substrate and subsequently seal the module with a low cost solder seal after the thin film interconnects have been built and tested, without affecting the performance or reliability of the thin film interconnect structure.

While the present invention has been particularly described, in conjunction with a specific preferred embodiment, it is evident that many alternatives, modifications and variations will be apparent to those skilled in the art in light of the foregoing description, it is therefore contemplated that the appended claims will embrace any such alternatives, modifications and variations as falling within the true scope and spirit of the present invention.

Thus, having described the invention, what is claimed is:

1. A reworkable hermetic module for encapsulating at least one microelectronic device having a thin film wiring layer comprising:

a cap for said module having a mating surface extending uninterruptedly around the periphery of said cap;

a substrate for said module, said substrate having a polished planar upper surface upon which is deposited a thin film wiring layer for said mircroelectronic device comprising at least one polymeric dielectric material and at least one wiring path of metallic material, said substrate having a mating surface on said polished surface extending uninterruptedly around the periphery of said substrate;

at least one thin film sealing layer on the mating surface of said substrate, said sealing layer having a thickness of less than about 0.001 in. and comprising a metal capable of wetting molten solder which has a melting point no greater than about 400° C. and adhering to said solder after solidification; and a layer of said solder on said substrate forming a hermetic seal for said module.

2. The module of claim 1 wherein said thin film sealing layer on sad substrate comprises successive layers of chromium, nickel and gold deposited directly on the mating surface.

3. The module of claim 1 wherein said metal is selected from the group consisting of chromium nickel, copper and gold.

4. The module of claim 1 wherein said solder is selected from the group consisting of solders comprising lead, tin, bismuth, Indium, gold or antimony.

5. The module of claim 1 wherein said thin film sealing layer is applied directly on the surface of the substrate without an intermediate treatment layer.

6. The module of claim 1 wherein said polished planar upper surface of said substrate upon which is deposited said thin film wiring layer and said thin film sealing layer has a surface roughness no greater than about 500 angstroms.

7. A reworkable hermetic module for encapsulating at least one microelectronic device having a thin film wiring layer comprising:

a cap for said module having a mating surface extending uninterruptedly around the periphery of said cap;

a substrate for said module, said substrate having a polished planar upper surface upon which is deposited a thin film wiring layer for said mircroelectronic device comprising at least one polymeric dielectric material and at least on wiring path of metallic material, said substrate having a mating surface on said polished surface extending uninterruptedly around the periphery of said substrate;

at least one thin film sealing layer on the mating surface of said substrate, said sealing layer having a thickness of less than about 0.001 in. and comprising successive layers of chromium, nickel and gold deposited directly on the mating surface; and a layer of said solder on said substrate forming a hermetic seal for said module.

8. The module of claim 7 wherein said solder is selected from the group consisting of solders comprising lead, tin, bismuth, Indium, gold or antimony.

9. The module of claim 7 wherein said polished planar upper surface of said substrate upon which is deposited said thin film wiring layer and said thin film sealing layer has a surface roughness no greater than about 500 angstroms.

10. A reworkable hermetic module for encapsulating at least one microelectronic device having a thin film wiring layer comprising:

- a cap for said module having a mating surface extending uninterruptedly around the periphery of said cap;
- a substrate for said module, said substrate having a polished planar upper surface having a surface roughness no greater than about 500 angstroms upon which is deposited a thin film wiring layer for said microelectronic device comprising at least one polymeric dielectric material and at least one wiring path of metallic material, said substrate having a mating surface on said polished surface extending uninterruptedly around the periphery of said substrate;
- at least one thin film sealing layer on the mating surface of said substrate, said sealing layer having a thickness of less than about 0.001 in. and comprising successive layers of chromium, nickel and gold deposited directly on the mating surface; and
- a layer of said solder on said substrate forming a hermetic seal for said module.

* * * * *